US012682199B2

(12) United States Patent
Kim

(10) Patent No.: US 12,682,199 B2
(45) Date of Patent: Jul. 14, 2026

(54) FRAME DELAY TIME COUNTING CIRCUIT AND NEAR FIELD COMMUNICATION CARD INCLUDING THE SAME

(71) Applicant: SAMSUNG ELECTRONICS CO., LTD., Suwon-si (KR)

(72) Inventor: Jicheol Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 19/184,008

(22) Filed: Apr. 21, 2025

(65) Prior Publication Data

US 2026/0065006 A1 Mar. 5, 2026

(30) Foreign Application Priority Data

Sep. 2, 2024 (KR) ......................... 10-2024-0118805

(51) Int. Cl.
*G06K 19/07* (2006.01)
*H03K 21/00* (2006.01)

(52) U.S. Cl.
CPC ......... *G06K 19/0723* (2013.01); *H03K 21/00* (2013.01)

(58) Field of Classification Search
CPC ........................... G06K 19/0723; H03K 21/00
USPC ........................................................ 235/492
See application file for complete search history.

(56) References Cited

U.S. PATENT DOCUMENTS 8,203,430 B2 6/2012 Breitfuss et al.
9,608,797 B2 3/2017 Choke et al.

10,740,575 B1 8/2020 Kim et al.
2015/0108210 A1* 4/2015 Zhou ...................... G01S 5/0247
235/375
2015/0207616 A1* 7/2015 Choke ................... H04L 7/0041
455/41.1
2019/0149196 A1* 5/2019 Hueber .................. H04B 5/266
340/10.1
2020/0272799 A1* 8/2020 Kim ................... G06K 7/10237
(Continued)

FOREIGN PATENT DOCUMENTS

CN 102968657 B 7/2016
CN 104346645 B 3/2017
(Continued)

OTHER PUBLICATIONS

International Standard ISO/IEC 14443-3, "Identification cards—Contactless integrated circuit cards—Proximity card—Part 3: Initialization and anticollision", Third edition Jun. 1, 2016, 72 pages.

*Primary Examiner* — Allyson N Trail
(74) *Attorney, Agent, or Firm* — Morgan, Lewis & Bockius LLP

(57) ABSTRACT

A near field communication (NFC) card includes a frame delay time (FDT), wherein the FDT counting circuit includes a first comparator configured to compare the envelope voltage signal with a first reference voltage and output a first comparison output signal, a second comparator configured to compare the envelope voltage signal with a second reference voltage and output a second comparison output signal, an FDT compensation circuit configured to output a compensation signal based on the first comparison output signal and the second comparison output signal, and a trigger generation circuit configured to output the trigger signal based on the first comparison output signal and the compensation signal.

20 Claims, 13 Drawing Sheets

(56)     References Cited

U.S. PATENT DOCUMENTS

| | | | |
|---|---|---|---|
| 2020/0356734 A1* | 11/2020 | Rasmussen ........... | G01S 13/767 |
| 2021/0184728 A1* | 6/2021 | Kang ....................... | H04B 5/45 |
| 2024/0330613 A1* | 10/2024 | Kang ................... | G06K 7/0166 |

FOREIGN PATENT DOCUMENTS

| | | | |
|---|---|---|---|
| CN | 103870868 B | 4/2017 | |
| CN | 115865138 B | 6/2023 | |

* cited by examiner

FIG. 3

| | LSB | | | | | | MSB | |
|---|---|---|---|---|---|---|---|---|
| S | b1 | b2 | b3 | b4 | b5 | b6 | b7 | E |

Data Transmission PCD → PICC, Miller Coding

FRAME DELAY TIME COUNTING CIRCUIT AND NEAR FIELD COMMUNICATION CARD INCLUDING THE SAME

CROSS-REFERENCE TO RELATED APPLICATION

This U.S. non-provisional patent application claims priority under 35 U.S.C. § 119 to Korean Patent Application No. 10-2024-0118805, filed on Sep. 2, 2024, in the Korean Intellectual Property Office, the disclosure of which is incorporated by reference herein in its entirety.

BACKGROUND

The inventive concept relates to a near field communication (NFC) system, and more particularly, to a frame delay time (FDT) counting circuit of an NFC card.

Contactless NFC card communication uses a communication protocol specified by the International Organization for Standardization (ISO) and International Electrotechnical Commission (IEC) 14443 standard. The ISO/IEC 14443 standard specifies a protocol of signal transmission between NFC card readers and NFC cards. The protocol includes specifications of transmission signal such as rising and falling times of the transmission signal, and modulation indexes (MI) of pause sections included in the transmission signal. The protocol also specifies frame delay time (FDT) which indicates a time delay for the NFC cards to initiate transmitting operation to the NFC card readers after receiving transmission signals from the NFC card readers. The FDT may fluctuate depending on the characteristics of the NFC card readers and/or NFC cards and variations of the communication environments. In some situation, the FDT fluctuation may exceed preset value specified in the standard and the near field communication between the card readers and the NFC cards may not be possible or may suffer a severe degradation of the communication efficiency. Therefore, it is necessary to control the FDT fluctuation within a value specified in the standard.

SUMMARY

A near field communication (NFC) card including a rectification and filtering circuit configured to receive a radio signal and generate an envelope voltage signal based on the radio signal in which the envelope voltage signal includes a plurality of pause sections, and a frame delay time (FDT) counting circuit configured to detect a rising section of a last pause section, measure the rising slope of the last pause section and generate a trigger signal which triggers a transmitting operation of the NFC card within a frame delay time (FDT) from the rising section of the last pause section, wherein the FDT counting circuit comprises a first comparator configured to compare the envelope voltage signal with a first reference voltage and output a first comparison output signal, a second comparator configured to compare the envelope voltage signal with a second reference voltage and output a second comparison output signal, an FDT compensation circuit configured to output a compensation signal based on the first comparison output signal and the second comparison output signal, and a trigger generation circuit configured to output the trigger signal based on the first comparison output signal and the compensation signal.

A frame delay time (FDT) counting circuit in a near field communication (NFC) card, the FDT counting circuit including a first comparator configured to compare an envelope voltage signal with a first reference voltage and output a first comparison output signal, a second comparator configured to compare the envelope voltage signal with a second reference voltage and output a second comparison output signal, an FDT compensation circuit configured to generate a compensation signal based on the first comparison output signal and the second comparison output signal, and a trigger generation circuit configured to output a trigger signal based on the first comparison output signal and the compensation signal, wherein the trigger signal initiates a transmitting operation of the NFC card.

A near field communication (NFC) system comprising an NFC card, wherein the NFC card includes a rectification and filtering circuit configured to receive a radio signal and generate an envelope voltage signal based on the radio signal, and the envelope voltage signal including a plurality of pause sections, and a frame delay time (FDT) counting circuit configured to detect a rising section of a last pause section, measure the rising slope of the last pause section, and generate a trigger signal based on the measured value of the rising slope of the last pause section, and the trigger signal triggering a transmitting operation of the NFC card within a frame delay time (FDT) from the rising section of the last pause section, wherein the FDT counting circuit comprises a first comparator configured to compare the envelope voltage signal with a first reference voltage and output a first comparison output signal, a second comparator configured to compare the envelope voltage signal with a second reference voltage and output a second comparison output signal, an FDT compensation circuit configured to output a compensation signal based on the first comparison output signal and the second comparison output signal, and a trigger generation circuit configured to output the trigger signal based on the first comparison output signal and the compensation signal.

BRIEF DESCRIPTION OF THE DRAWINGS

The features and advantages of the present disclosure will become apparent and more readily understood from the following description of example embodiments, taken in conjunction with the accompanying drawings of which:

FIGS. 3, 4, 5 and 6 are diagrams illustrating examples of frames and pause sections of an A-type interface protocol of ISO/IEC 14443;

DETAILED DESCRIPTION

Hereinafter, embodiments of the present inventive concept are described in detail with reference to the accompanying drawings.

The terms "input voltage," "input voltage level," and "radio signal" are used interchangeably. These terms may have the same meaning or different meanings depending on the context of embodiments, and the meaning of each term may be understood in the context of embodiments described below.

Figure 1:
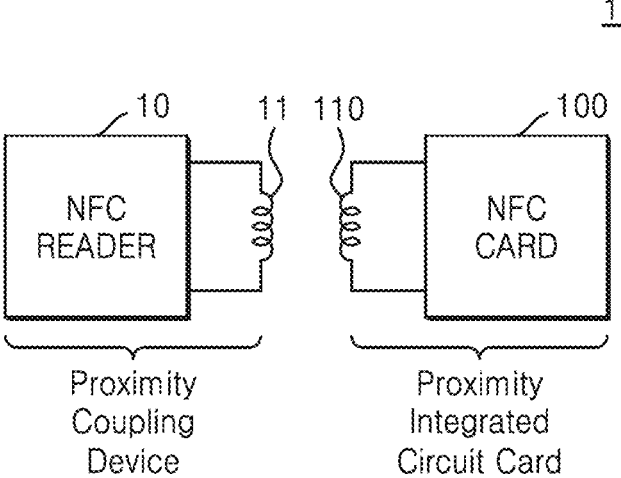
FIG. 1 is a block diagram illustrating a near field communication (NFC) system according to an example embodiment.

FIG. 1 is a block diagram illustrating a near field communication (NFC) system according to an example embodiment.

Referring to FIG. 1, an NFC system 1 may include an NFC reader 10 and an NFC card 100. The NFC reader 10 may also be referred to as a proximity coupling device (PCD), and the NFC card 100 may also be referred to as a proximity integrated circuit card (PICC) or contactless integrated circuit card (CICC). Alternatively, the NFC reader 10 may be referred to as an interrogator, and the NFC card 100 may be referred to as a tag, a label, or a transponder.

Unless otherwise noted, the NFC card 100 and the NFC reader 10 described hereinafter may be in compliance with the ISO/IEC 14443 Type-A standard.

The NFC reader 10 includes an antenna coil 11, and receives and transmits signals through the antenna coil 11, and the NFC card 100 includes an antenna coil 110, and receives and transmits signals through the antenna coil 110.

The ISO/IEC 14443 standard specifies proximity communication, which has a transmission range of about 10 cm. The standard may be categorized as either Type-A or Type-B, depending on how the data is modulated and encoded and how collision avoidance is implemented.

For example, ISO/IEC 14443 Type A specifies receiving and transmitting signals to be a bit rate of 106 kbps (kilo-bit per second), which is a fraction of one-hundred-twenty-eight of carrier frequency (fc) where the carrier frequency is 13.56 MHz. The transmitting signals are modulated to have the carrier frequency (fc) by an amplitude-shift keying (ASK) 100% modulation scheme before transmitting from the NFC reader 10 to the NFC card 100 or transmitting from the NFC card 100 to the NFC reader 10. The NFC reader 10 also may supply power through the transmitted signals to the NFC card 100. The NFC card 100 may extract power from the transmitted signal and may continue receiving and transmitting operation without independent power supply. The transmitted signals may be modulated by modified Miller coding scheme. Because the modulated signals are modulated with the carrier frequency, the modulated signals are transmitted with 128 times bit rate of the data signals. The NFC reader 10 may transmit the modulated signals by radiating intense electromagnetic waves through the antenna coil 11. The NFC card 100 may receive the electromagnetic waves through magnetic induction with antenna coil 110 of the NFC card 100. The NFC card 100 may extract data signals and power from the received signals by demodulating the received signals. For efficient data communication and power transmission, the antenna coils and other passive elements of the NFC reader 10 and the NFC card 100 are designed to have same resonant frequency. Though the NFC system 1 according to this embodiment is described in compliance with the ISO/IEC 14443 Type-A standard, the inventive concept is not limited to a specific standard type.

According to an example embodiment, the NFC card 100 may use a subcarrier load modulation method in which an on/off keying (OOK) modulation method is combined with a Manchester coding for transmitting data signals to the NFC reader 10. The amplitude of the data signals transmitted from the antenna coil 110 of the NFC card 100 to the NFC reader 10 may be changed by adjusting a load resistance value, thereby waveforms of the data signals become similar to those of the ASK modulation.

According to an example embodiment, the NFC reader 10 may send a request data frame to the NFC card 100 for selecting the NFC card 100. The NFC reader 10 may expect an answer data frame from the selected NFC card within a preset time after sending the request data frame. Each of the request data frame and the answer data frame is a sequence of bits defined in ISO/IEC 14443 standard respectively. The request data frame may include start bit and end bit as well as data bits. The start bit and end bit may indicate the start and end of the request data frame respectively. The answer data frame may include length information and parity bits as well as data bits requested by the NFC reader 10. The length information identifies the total size of the answer data frame and parity bits are used for the NFC reader 10 to decide whether the answer data frame includes an error. In case of not receiving the answer data frame within the preset time after sending the request data frame from the NFC card 100, the NFC reader 10 may determine that the NFC card 100 has failed to receive the request data frame. The failure of communication typically happens when the NFC card 100 is not ready to send answer data frame requested from the NFC reader 10 within the preset time after identifying the last bit of the request data frame transmitted from the NFC reader 10.

According to an example embodiment, the preset time may be referred to as a frame delay time (FDT), and the NFC card 100 needs to initiate data transmission operation within the FDT specified in the standard. For implementing the preset time requirement in a circuit level, the NFC card 100 may detect and measure the rising slope of the pause section of the last bit in the request data frame sent to the NFC card 100 by counting the rising section of the pause section of the last bit with an internal clock. The number of clocks counted from the rising section of the pause section referred as an FDT count value. The FDT count value multiplied with the internal clock period may correspond to the FDT. The preset number of internal clocks required for the NFC card 100 to initiate a data transmission operation may be referred as a trigger reference count value. When the FDT count value reaches the trigger reference count value, the NFC card 100 may start transmitting data signals to the NFC reader 10. Typically, the trigger reference count value may have a range of maximum and minimum values because of FDT fluctuation which is inevitable due to mismatches between the antenna coil 11 of the NFC reader 10 and the antenna coil 110 of the NFC card 100 and variations of communication environment. ISO/IEC 14443 Type-A standard specifies the allowed range of FDT based on the carrier frequency (fc) which is 13.56 MHz in Type-A standard. When the FDT fluctuation exceeds the preset allowed range, in other words, when the FDT count value does not reach to the trigger reference count value within the FDT, the FDT reader 10 may recognize this as a timed-out failure. FDT counting operation will be described in detail with reference to FIGS. 11, 12, and 13.

Figure 2:
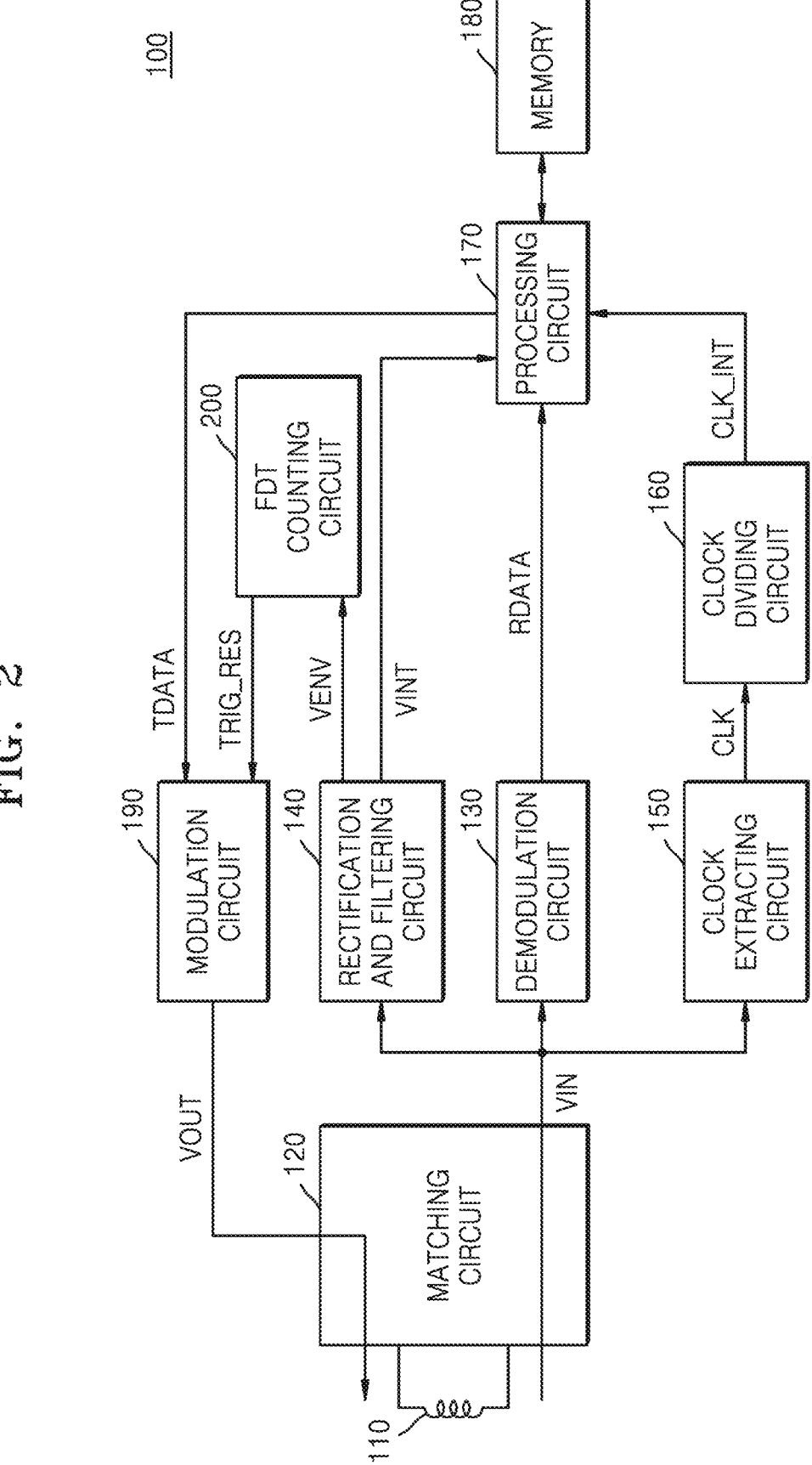
FIG. 2 is a block diagram illustrating an NFC card according to an example embodiment.

FIG. 2 is a block diagram illustrating an NFC card 100 according to an example embodiment.

Referring to FIG. 2, the NFC card 100 may include an antenna coil 110, a matching circuit 120, a demodulation circuit 130, a rectification and filtering circuit 140, a clock extracting circuit 150, a clock dividing circuit 160, a processing circuit 170, memory 180, and a modulation circuit 190.

Alternatively, the NFC card 100 may be implemented as a single transmitting/receiving circuit which includes the antenna coil 110, the matching circuit 120, the demodulation circuit 130, the rectification and filtering circuit 140, the clock extracting circuit 150, the clock dividing circuit 160, and/or the modulation circuit 190.

The antenna coil 110 of the NFC card 100 may generate an electromagnetic wave through mutual coupling action with the antenna coil 11 of the corresponding NFC reader 10 for receiving and transmitting data signals. Additionally, the NFC card 100 may be supplied with power through magnetic induction between the antenna coil 110 of the NFC card and the antenna coil 11 of the NFC reader 10. The mutual coupling action between the antenna coil 110 of the NFC card and the antenna coil 110 of the NFC reader 10 may be induced by matching a resonance frequency of the antenna coil 110 of the NFC card 100 with a resonance frequency of the antenna coil 11 of the NFC reader 10. The resonance frequency of the NFC card 100 may be determined by adjusting inductance value of the antenna coil 110 and corresponding capacitance value of a capacitor included in the matching circuit 120. Likewise, the resonance frequency of the NFC reader 10 may be determined by adjusting inductance value of the antenna coil 11 and corresponding capacitance value of a capacitor included in the NFC reader 10.

Additionally, by adjusting the impedance of a signal transmission path with the matching circuit 120, the signal transmission efficiency between the NFC reader 10 and the NFC card 100 may be improved. For example, the matching circuit 120 may select, through switching, either a capacitor for receiving operation or a capacitor for transmitting operation.

The antenna coil 110 and the matching circuit 120 may also be referred to as a resonant circuit. The resonant circuit of the NFC card 100 may receive an input voltage VIN which is induced by mutual coupling action with a resonant circuit of the NFC reader 10. The matching circuit 120 may provide the input voltage VIN to the demodulation circuit 130, the rectification and filtering circuit 140, and the clock extracting circuit 150. The input voltage VIN may correspond to the request data frame sent from the NFC reader 10.

The demodulation circuit 130 may generate reception data RDATA by demodulating the input voltage VIN and provide the reception data RDATA to the processing circuit 170. The reception data RDATA may be a demodulated data which is previously modulated with ASK 100% amplitude modulation scheme and modified Miller coding scheme in the NFC reader 10. The processing circuit 170 may store, in the memory 180, the reception data RDATA.

Figure 5:
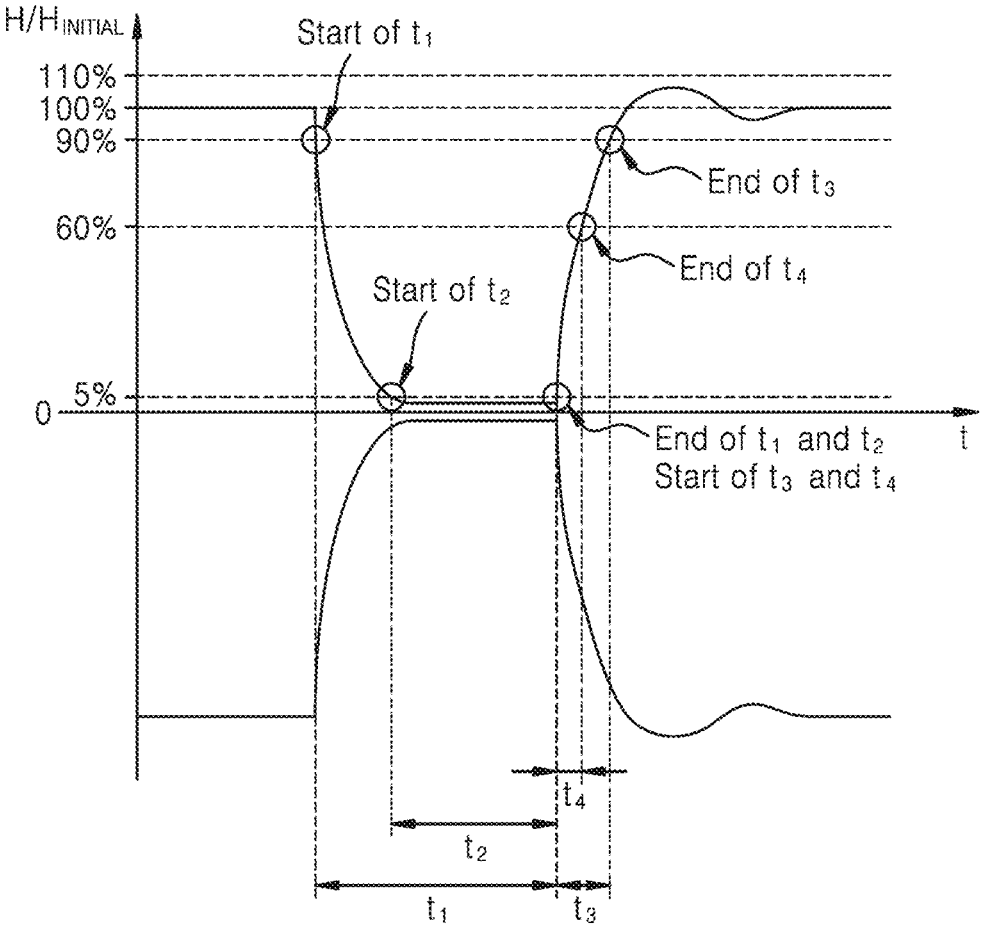
Figure 6:
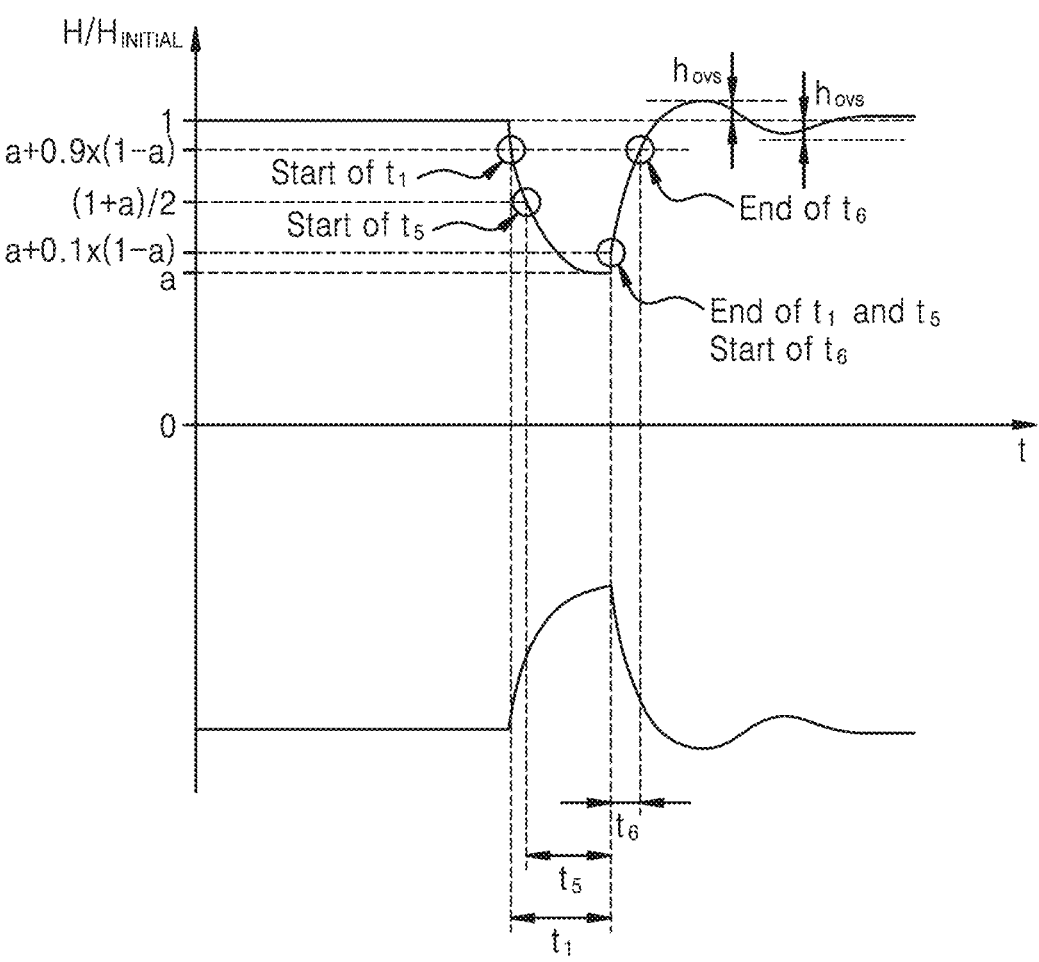
Figure 7:
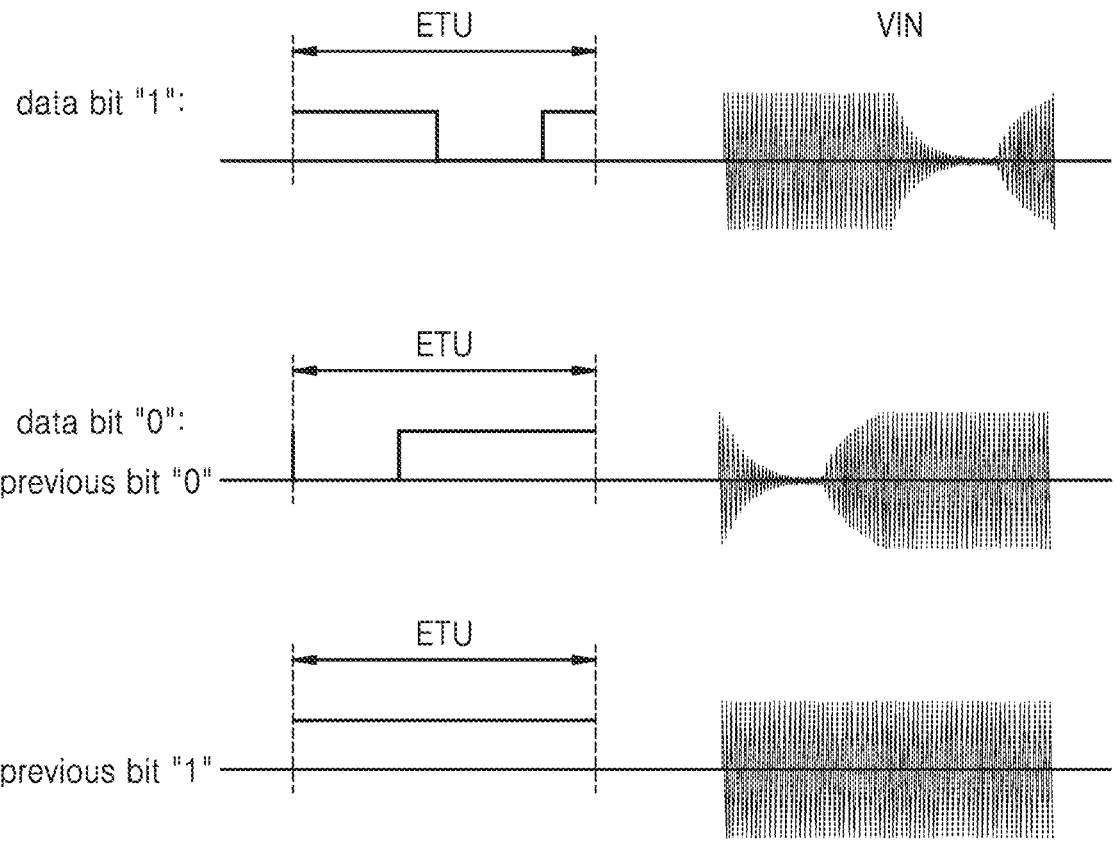
FIG. 7 is a diagram illustrating an encoding scheme according to a modified Miller coding scheme.

The rectification and filtering circuit 140 may output an envelope voltage signal VENV with respect to the input voltage VIN. The voltage level of the envelope voltage signal VENV may be the envelope of the input voltage VIN. According to an example embodiment, the envelope voltage signal VENV may include seven-bit data, and some of bit data includes a pause section as illustrated in FIGS. 5, 6, and 7. The rectification and filtering circuit 140 may output the envelope voltage signal VENV by rectifying and filtering the input voltage VIN.

The rectification and filtering circuit 140 may include a rectification circuit and a low-pass filter. The rectification circuit rectifies the input voltage VIN and the rectified input voltage is passed through the low-pass filter. By filtering out high frequency element of the rectified input voltage, the rectification and filtering circuit 140 may output the envelope voltage signal VENV having bit rate of data signals. The rectification and filtering circuit 140 may provide the envelope voltage signal VENV to an FDT counting circuit 200. Because the cutoff frequency of the low-pass filter is less than the carrier frequency (fc) of the radio signal received by the antenna coil 110, the carrier frequency component of the received radio signal is removed by the low-pass filter, thereby the voltage level of the envelope voltage signal VENV may represent the envelope of the radio signal. For example, the carrier frequency (fc) may be 13.56 MHz, and the cutoff frequency of the low-pass filter may be set to be less than 13.56 MHz to filter out the carrier frequency element of the radio signal.

Additionally, the rectification and filtering circuit 140 may generate an internal voltage VINT by rectifying the input voltage VIN for supplying power to the NFC card 100.

For generating the internal voltage VINT, the rectification and filtering circuit 140 may further include a regulation circuit which regulates output of the filtering circuit. The internal voltage VINT may be provided to the processing circuit 170 or to any other components in the NFC card 100, such as the demodulation circuit 130, the clock extracting circuit 150, the modulation circuit 190, and the FDT counting circuit 200.

The clock extracting circuit 150 may generate a clock signal CLK having the carrier frequency (fc) of the radio signal based on the input voltage VIN. The clock extracting circuit 150 may extract the clock signal CLK from the received radio signal by passing the received radio signal through a high-pass filter in the clock extracting circuit 150.

The clock dividing circuit 160 may generate an internal clock signal CLK_INT by dividing the clock signal CLK. The internal clock signal CLK_INT may have various frequencies. The clock dividing circuit 160 may provide the internal clock signal CLK_INT to the processing circuit 170 and any other components in the NFC card 100 such as the demodulation circuit 130, the clock extracting circuit 150, the modulation circuit 190, and the FDT counting circuit 200.

The processing circuit 170 may control overall operations of the NFC card 100. For example, during a receiving operation, the processing circuit 170 may receive the reception data RDATA from the demodulation circuit 130 and store the reception data RDATA in the memory 180. During a transmitting operation, the processing circuit 170 may read out transmission data TDATA from the memory 180 and provide the transmission data TDATA to the modulation circuit 190.

The modulation circuit 190 may modulate the transmission data TDATA to generate an output voltage VOUT and may transmit the output voltage VOUT to the NFC reader 10. The modulation circuit 190 may load the modulated transmission data TDATA on the resonant circuit of the modulation circuit 190, and provides the output voltage VOUT to the NFC reader 10 through the antenna coil 110.

According to an embodiment, the modulation circuit 190 may provide the output voltage VOUT to the NFC reader 10 in response to a trigger signal TRIG_RES of the FDT counting circuit 200. The modulation circuit 190 may start data transmitting operation immediately after activation of the trigger signal TRIG_RES provided by the FDT counting circuit 200. The trigger signal TRIG_RES need to be activated to initiate a transmitting operation within the FDT specified in the ISO/IEC 14443 Type-A standard. The data signals transmitted by the NFC card 100 may be the answer data frame which may be a response of the request data frame previously received from the NFC reader.

The trigger signal TRIG_RES may also be provided to the processing circuit 170. The processing circuit 170 may control the modulation circuit 190 in response to the trigger signal TRIG_RES, and the NFC card 100 may initiate the transmitting operation. For this case, the trigger signal TRIG_RES of the FDT counting circuit 200 may initiate transmitting operation of the NFC card 100 by providing the output voltage VOUT to the NFC reader 10 as a radio signal. The NFC card 100 may provide the answer data frame to the NFC reader 10 within FDT from the last bit of the request data frame transmitted by the NFC reader 10.

The FDT counting circuit 200 may detect, based on the envelope voltage signal VENV, a rising section of the last pause section in the request data frame and may output the trigger signal TRIG_RES for the NFC card 100 to initiate the transmitting operation within the specified FDT after the rising section of the last pause section. The last pause section may be a pause section of the last data bit of the request data frame or may be a pause section of the end bit of the request data frame when the last data bit of the request data frame does not include a pause section.

The FDT counting circuit 200 may generate the trigger signal TRIG_RES based on the envelope voltage signal VENV and provide to the modulation circuit 190. The specific operation of the FDT counting circuit 200 for generating the trigger signal TRIG_RES based on the envelope voltage signal VENV will be described in more detail with reference to FIGS. 9 to 13.

According to an example embodiment, by detecting and measuring the rising slope of the last pause section of the envelope voltage signal VENV, the NFC card 100 may compensate the effect of the rising slope in the FDT count value. More particularly, the NFC card 100 may detect and measure the rising slope of the last pause section of an envelope voltage signal VENV, and may compensate the trigger reference count value, thereby modifying an FDT count value required for triggering data transmission operation of the NFC card 100. As a result of compensating the preset time by modifying the trigger reference count value, the FDT count value required for triggering the transmitting operation of the NFC card 100 may be reduced, thereby preventing timed-out failure and improving compatibility between the NFC card 100 and the NFC reader 10.

FIGS. 3, 4, 5 and 6 are diagrams illustrating examples of data frames and pause sections of an A-type interface protocol of ISO/IEC 14443.

Figure 3:
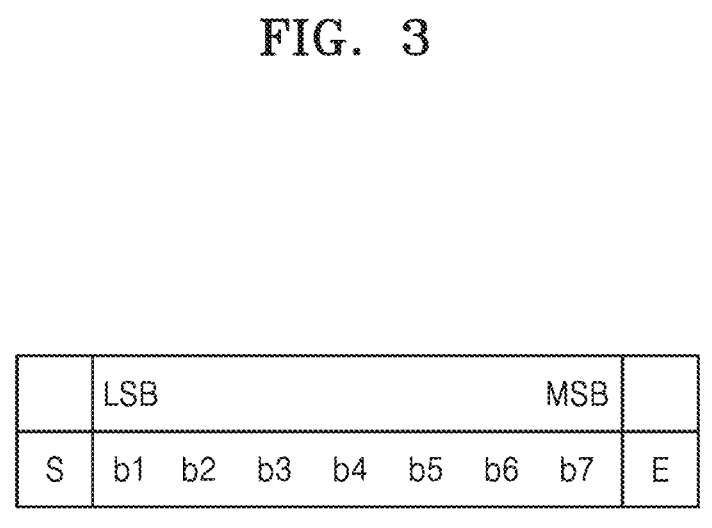
Figure 4:
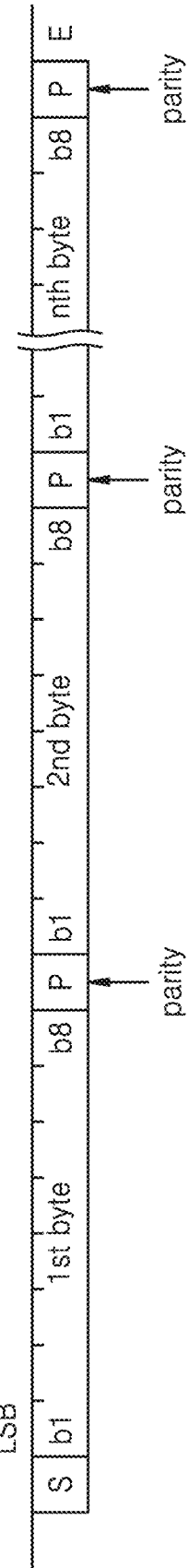

FIGS. 3 and 4 illustrates data frames received/transmitted between the NFC reader 10 and the NFC card 100 in compliance with ISO/IEC 14443 Type-A standard. FIG. 3 shows a short data frame including a start bit S, data bits b1 to b7, and an end bit E The short data frame may be transmitted from the NFC reader 10 to the NFC card 100. The lower bits of the short data frame, for example, b1, b2, b3, and b4 may be used for identifying the NFC card 100 for the NFC reader 10 to request the answer data frame. The upper bits of the short data frame, for example, b5, b6, and b7 may be used for defining maximum size of data frames for the NFC reader 10 to receive from the NFC card 100. FIG. 4 illustrates a standard data frame including a combination of a start bit S, data bits b1 to b8, a parity bit P, and an end bit E. A series of the standard data frames may be transmitted from the NFC card 100 to the NFC reader 10 in response to the request of the NFC reader 10. The series of the standard data frame may include a data length information and a parity bit as well as data bits requested by the NFC reader 10. The length information identifies the total size of the series of the standard data frames which may not exceed the maximum size of the data frame defined in the short data frame received by the NFC card 100. The parity bits may be used for cyclic redundancy check (CRC) through which the NFC reader 10 may decides whether the standard data frames received from the NFC card 100 include errors. The series of the standard data frames may be the answer data frame requested by the NFC reader with the request data frame.

Additionally, the short data frames may be used in NFC communications with a bit rate of 106 kbps which is one fraction from one-hundred-twenty-eight of the carrier frequency (fc/128), and the standard data frames may be used in NFC communications with a bit rate of 212 kbps (fc/64), a bit rate of 424 kbps (fc/32), or a bit rate of 848 kbps (fc/16).

FIG. 5 illustrates a pause section waveform of an envelope voltage signal VENV in the short data frame. FIG. 6 illustrates a pause section waveform of an envelope voltage signal VENV in the standard data frame.

Referring to FIGS. 5 and 6, the horizontal axis represents time and the vertical axis represents a field signal from the NFC reader 10 or from the NFC card 100. The parameter "a" in FIG. 6 represents the pulse shape factor of A-type communication. "H" and "$H_{initial}$" represent the equivalent homogeneous magnetic field strength and the strength of the unmodulated RF field respectively. "$h_{ovs}$" represents the envelope overshoot. "$t_1$" in FIGS. 5 and 6 represents the length of the pause section respectively. "$t_2$" and "$t_5$" represent the low level periods of the pause section respectively. "$t_3$" and "$t_6$" represent the rising time of the pause section respectively, and "$t_4$" represents a partial section of the rising time of the pause section.

The demodulation circuit 130 of the NFC card 100 may extract each bit from the received radio signal in synchronization with a synchronization clock signal, separate the extracted bits into the start bit S, the data bits b1 to b7, and the end bit E, and detect the received data from the separated bits. On receiving the data request frame from the NFC reader 10, the NFC card 100 has to initiate transmitting operation for transmitting the answer data frames to the NFC reader 10 within the FDT specified in the standard. The NFC card 100 may start to measure the FDT from a rising start time point of the last pause section included in the last bit of the data request frame with an internal clock generated from the extracted clock.

FIG. 7 is a diagram illustrating an encoding scheme according to the modified Miller coding scheme.

Referring to FIG. 7, the modulated the data bits with carrier signal are sent to the NFC card 100 in a form of the radio signal. The modulated the data bits with carrier signal may corresponds to the request data frame. According to an example embodiment, data bits are encoded by a modified Miller coding scheme. When the radio signal is received by the NFC card, it may be referred as an input voltage VIN of the NFC card 100.

An elementary time unit (ETU) shown in FIG. 7 indicates a time period in which one data bit is transferred.

According to an example embodiment, the modified Miller coding encodes each data bit based on previous data bit. For example, data bit "1" is encoded by transitioning the previous data bit at middle of the ETU. If previous data bit is "1", data bit "1" is encoded by transitioning into a low level at middle of the ETU, thereby a low pulse waveform is formed after half period of the ETU. The low pulse waveform may correspond to a pause section of the envelope voltage VENV which is enveloped signal of the input voltage VIN.

Figure 8:
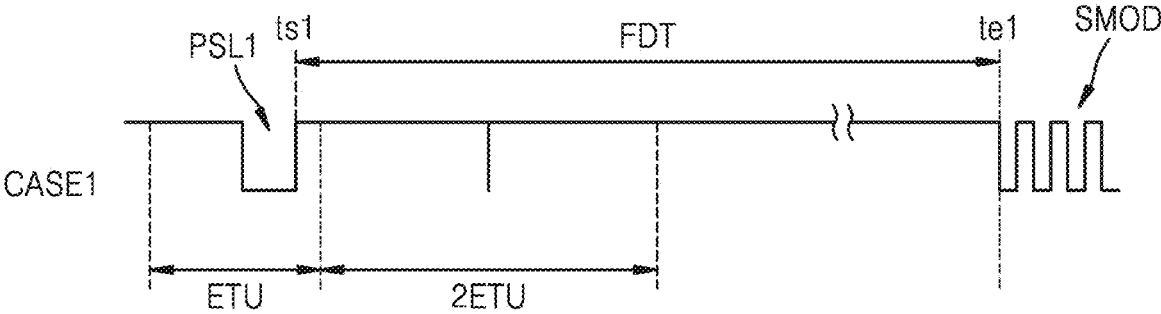
FIG. 8 is a diagram illustrating examples of frame delay time (FDT) counting.
Figure 8:
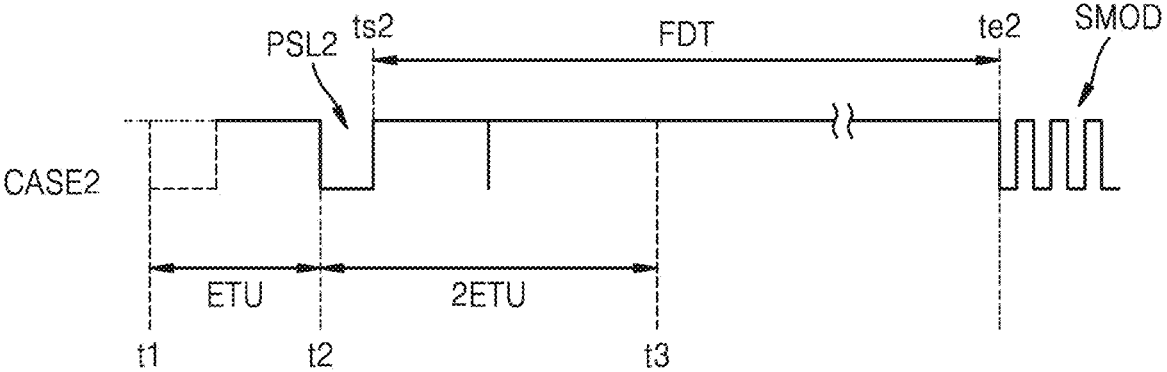

The data bit "0" may be encoded into two different ways, depending on values of the previous data bit. When the previous data bit is "0," data bit "0" is encoded by transitioning into a low level at the start of the ETU. The low pulse waveform may correspond to a pause section of the envelope voltage VENV which is an enveloped signal of the input voltage VIN. When the previous data bit is 1, data bit "0" is encoded by maintaining high level waveform during the ETU. FIG. 8 is a diagram illustrating examples of the FDT counting.

The ISO/IEC 14443 standard specifies the FDT. The FDT may be differently defined depending on command types and the logic value of the last data bit of the data request signal transmitted to the NFC card 100.

Referring to FIG. 8, the FDT may be defined as a time interval between the end point (rising start time points ts1 and ts2) of the last pause section PLS1 included in the last data bit of the data request frame transmitted by the NFC reader 10 and the start point of transmitting the answer data frame (SMOD) by the NFC card 100. As shown in FIG. 7, when the last data bit of the data request signal is data bit "0" and the previous data bit "1," the last data bit maintains high level during the ETU and does not include a pause section. For this case, the FDT counting may start at a pause section that immediately follows the last data bit in the request data frame.

Referring to FIGS. 7 and 8, a first case CASE1 illustrates a case in which the last data bit of the request data frame transmitted by the NFC reader 10 includes a pause section, and FDT counting starts at the rising point of the pause section (ts1). Two elementary time units following the last data bit may not include any low pulses.

Unlike the first case, a second case CASE2 shown in FIG. 8 illustrates a case when the last data bit of the request data frame is data bit "0" and the previous data bit "1." The last data bit maintains high level during the ETU and does not include a pause section. For this case, the FDT counting may start at a pause section that immediately follows the last data bit of the request data frame. NFC reader 10 may include a pause section at the start of the 2 ETU following the last bit data in the data request signal.

Figure 9:
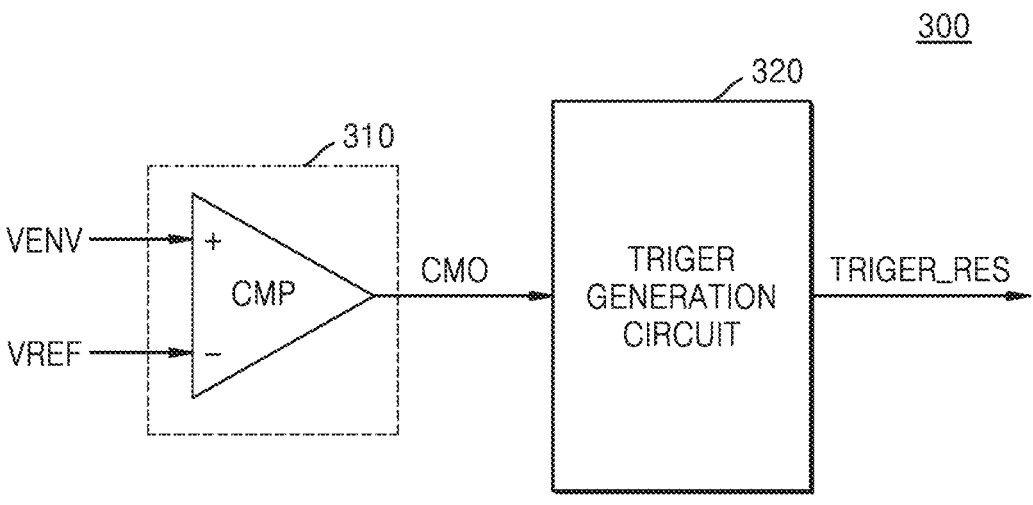
FIGS. 9 and 10 are diagrams illustrating an FDT counting operation according to an example embodiment.
Figure 10:
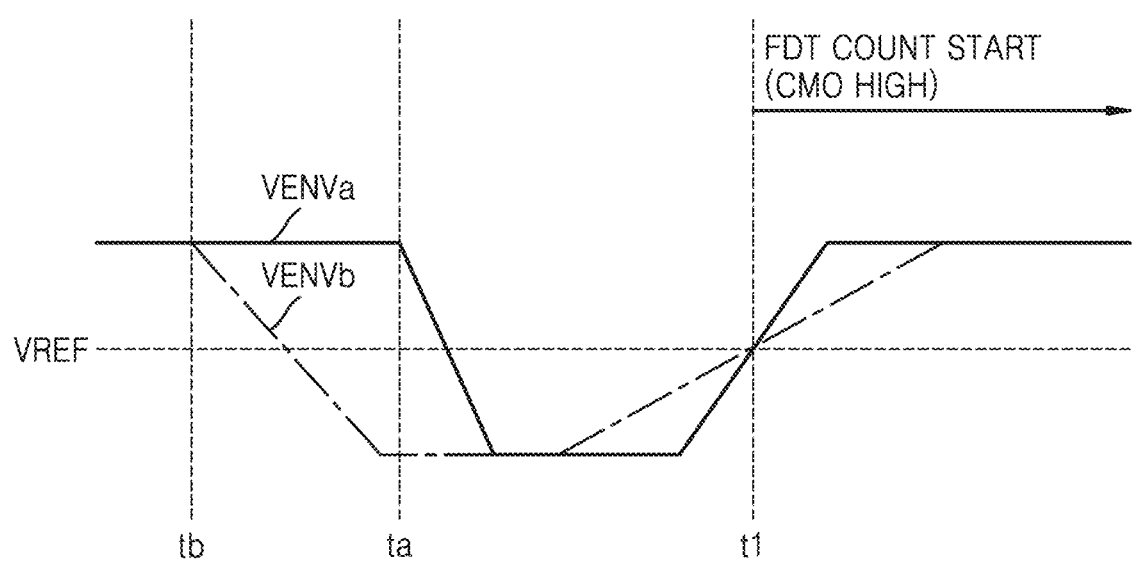

FIGS. 9 and 10 are diagrams illustrating a method of FDT counting according to an example embodiment.

Referring to FIG. 9, an FDT counting circuit 300 includes a comparison circuit 310 comprised of a single comparator CMP and a trigger generation circuit 320.

The comparator CMP compares an envelope voltage signal VENVa or VENVb with a reference voltage VREF to activate an output signal CMO. The rising of the last pause section of the frame transmitted by the NFC reader 10 is detected at a time point $t_1$. Although the envelope signals, VENVa and VENVb, are received at different time points ta and tb respectively, FDT counting may start at same time point t1.

The trigger generation circuit 320 may start the FDT counting in response to transition of the output signal CMO at the time point $t_1$, and output a trigger signal TRIGER_RES when an FDT count value reaches a preset value.

As shown in FIG. 10, although the envelope signals VENVa and VENVb are received at different time points ta and tb respectively, the FDT counting circuit 300 may start the FDT counting at the time point $t_1$ for both the envelope voltage signal VENVa and the envelope voltage signal VENVb.

Likewise, FDT counting may start at different time point even though the two envelope voltage signals may be received at same time depending on the difference of the rising slopes of the last pause section of the envelope voltage signal VENVa and the envelope voltage signal VENVb.

The difference of the rising slope of the last pause section may be caused by the distance or position between the antenna coil 110 of the NFC card 100 and the antenna coil 11 of the NFC reader 10.

Because the rising slope of the envelope voltage signal VENVb is slow as shown in FIG. 10, the FDT counting also start late and takes more time for the FDT count value to reach the preset count value, and the NFC card 100 may not respond to the NFC reader 10 within the FDT specified in the standard. In such a situation, the NFC reader 10 may recognize that the NFC card 100 has failed to receive the request data frame which is referred as timed-out failure. Consequently, some of the NFC cards may not become compatible with the NFC reader 10 due to the rising slope differences of the last pause section of the envelope voltage signal VENV.

According to an example embodiment, the NFC card 100 may detect the rising slope of the last pause section of the envelope voltage signal VENV and may prevent FDT failure by compensating an undue delay of the FDT caused by slow rising slope of the last pause section, and the compatibility between NFC reader 10 and the NFC cards may be improved.

Figure 11:
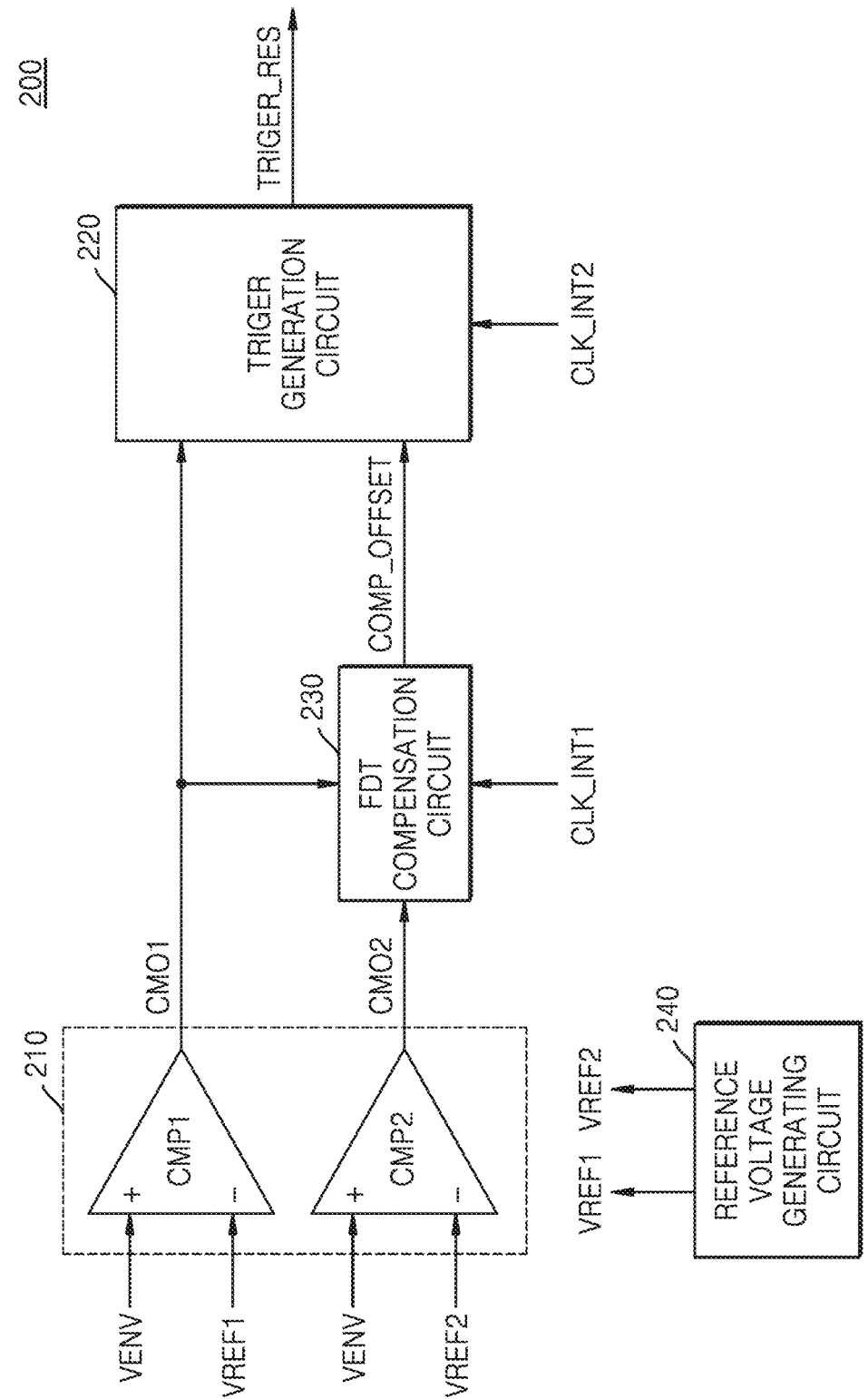
FIG. 11 is a block diagram illustrating an FDT counting circuit according to an example embodiment.
Figure 12:
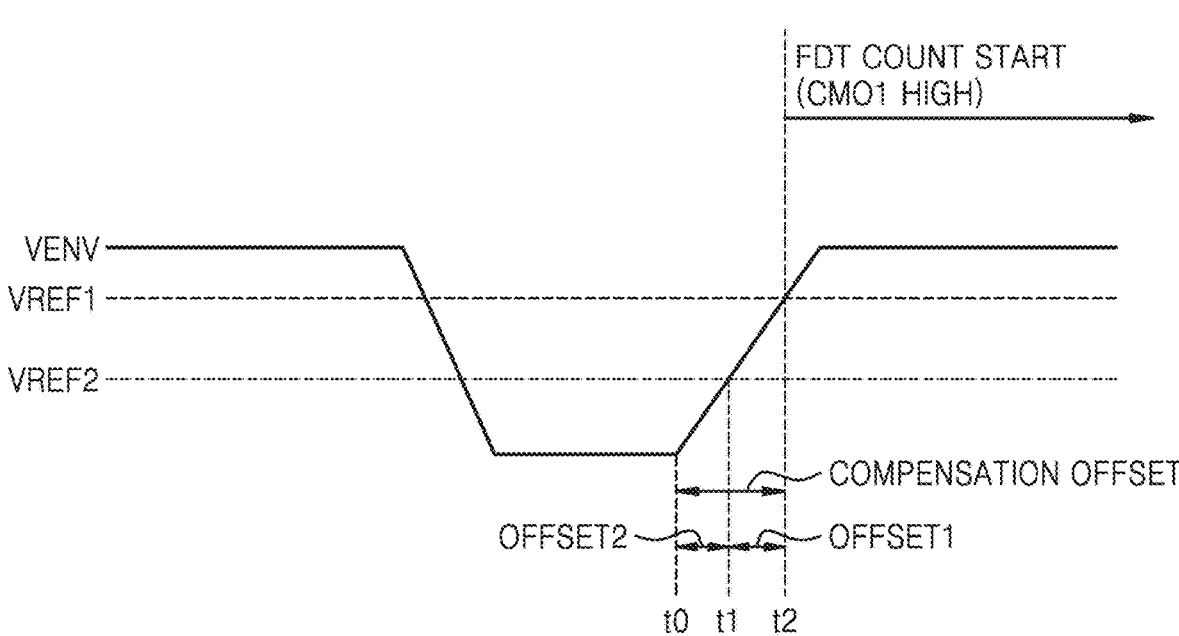
FIG. 12 is a diagram illustrating a method of counting FDT according to an example embodiment.

FIG. 11 is a block diagram illustrating an FDT counting circuit 200 according to an example embodiment, and FIG. 12 is a diagram illustrating a method of counting FDTs according to an example embodiment respectively.

Referring to FIG. 11, the FDT counting circuit 200 may include a comparison circuit 210, a trigger generation circuit 220, an FDT compensation circuit 230, and a reference voltage generating circuit 240.

The comparison circuit 210 may include a first comparator CMP1 and a second comparator CMP2. Unlike the comparison circuit 310 shown in FIG. 9 includes one comparator CMP, the comparison circuit 210 according to this example embodiment may include two comparators.

The first comparator CMP1 may compare an envelope voltage signal VENV and a first reference voltage VREF1 and may output an first comparison output signal CMO1. The first comparison output signal CMO1 may transit into different logic level when the voltage level of the envelope voltage signal VENV is greater than or equal to the level of the first reference voltage VREF1.

The second comparator CMP2 may compare an envelope voltage signal VENV and a second reference voltage VREF2, and may output an second comparison output signal CMO2. The second comparison output signal CMO2 may transit into different logic level when the voltage level of the envelope voltage signal VENV is greater than or equal to the level of the second reference voltage VREF2.

The reference voltage generation circuit 240 may generate the first reference voltage VREF1 and the second reference voltage VREF2. Referring to FIG. 12, the level of the first reference voltage VREF1 may be greater than the level of the second reference voltage VREF2.

The trigger generation circuit 220 may output a trigger signal TRIGER_RES based on the first comparison output signal CMO1 of the first comparator CMP1 and a compensation signal COMP_OFFSET of the FDT compensation circuit 230. The trigger signal TRIGER_RES may be provided to the modulation circuit 190 or the processing circuit 170 as shown in FIG. 2.

Referring to FIG. 11 and FIG. 12, the trigger generation circuit 220 may start the FDT counting operation in response to the transition of the first comparison output signal CMO1 of the first comparator CMP1, and output the trigger signal TRIGER_RES when the FDT count value reaches a trigger reference count value.

The trigger generation circuit 220 may include a counter and a timer. The timer may include a register that store the trigger reference count value. The counter may start the FDT counting operation in response to the transition of the first comparison output signal CMO1 of the first comparator CMP1 and stops when the FDT count value reaches to the trigger reference count value. Immediately after the FDT count value reaches to the trigger reference count value, the timer may generate the trigger signal TRIGER_RES. The NFC card 100 may start to transmit the answer data frame to the NFC reader 10 in response to the trigger signal TRIGER_RES.

The counter of the trigger generation circuit 220 may start the FDT counting operation in response to the transition of the first comparison output signal CMO1, and the timer of the trigger generation circuit 220 may trigger the data transmitting operation of the NFC card 100 when the FDT count value reaches the trigger reference count value.

The trigger reference count value may be compensated based on the compensation signal COMP_OFFSET. Referring to FIG. 11, the trigger generation circuit 220 may perform the FDT counting operation in synchronization with an internal clock signal CLK_INT2.

Figure 13:
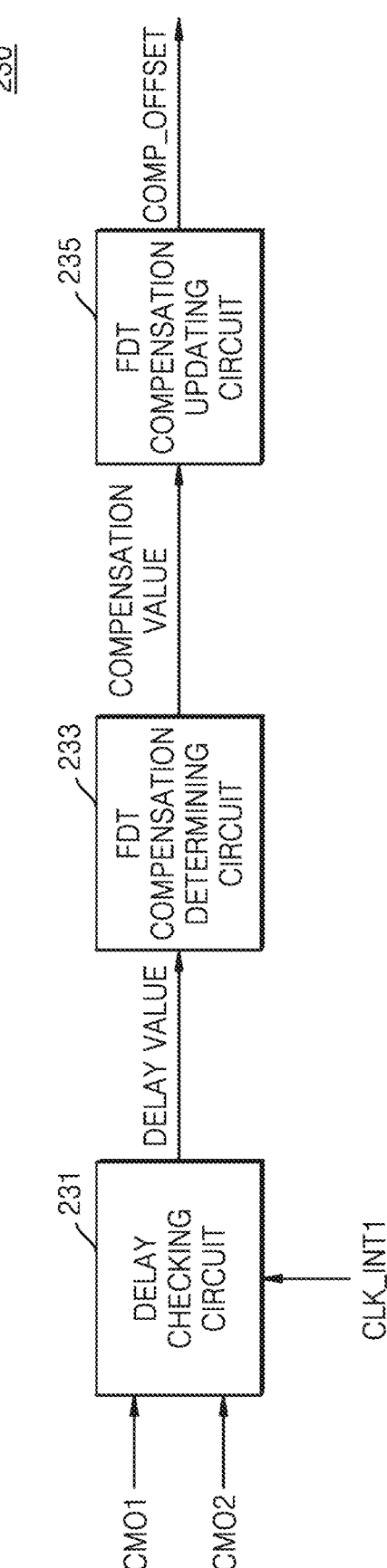
FIG. 13 is a block diagram illustrating an FDT compensation circuit according to an example embodiment.

Referring to FIGS. 11, 12, and 13, the NFC card 100 according to an example embodiment may detect and measure the rising slope of the last pause section of an envelope voltage signal VENV, and may compensate the trigger reference count value, thereby modifying an FDT count value required for triggering data transmission operation of the NFC card 100. As a result of compensating the preset time by compensating the trigger reference count value, the FDT count value required for triggering transmitting data signals of the NFC card 100 may be reduced, thereby preventing the timed-out failure and improving compatibility between the NFC card 100 and the NFC reader 10. Example embodiments will be described in detail with reference to FIGS. 9, 10, 11, 12 and 13.

In this embodiment, the trigger generation circuit 220 may update the trigger reference count value in response to the compensation signal COMP_OFFSET of the FDT compensation circuit 230.

For example, the trigger generation circuit 220 may update the trigger reference count value as shown in Equation 1 below.

$$\text{REF COUNT}_{TRIG} = \text{COUN}_{TLast\ Data\ Bit} - \text{COUNT}_{COM\_OFFSET} \qquad \text{Equation 1}$$

The REF COUNT$_{TRIG}$ in the Equation I may represent the trigger reference count value, COUNT$_{Last\ Data\ Bit}$ may represent the count value which is preset based on the value of the last data bit in the request data frame. For example, when the carrier frequency (fc) is 13.56 MHz, the COUNT$_{Last\ Data\ Bit}$ may be 1236 when the last bit is logic level "1" or may be 1172 when the last bit is logic level "0." The COUNT$_{COM\_OFFSET}$ may represent the count value compensated by the compensation signal COMP_OFFSET.

The trigger generation circuit 220 may update the trigger reference count value by subtracting the count value COUNT$_{COM\_OFFSET}$ compensated by the compensation signal COMP_OFFSET from the count value COUN$_{TLast\ Data\ Bit}$ according to the last bit value in the request data frame.

The FDT compensation circuit 230 may generate the compensation signal COMP_OFFSET based on the time interval between a transition point of the first comparison output signal CMO1 of the first comparator CMP1 and a transition point of the second comparison output signal CMO2 of the second comparator CMP2, and may provide the compensation signal COMP_OFFSET to the trigger generation circuit 220.

Referring to FIGS. 11 and 12, the trigger reference count value may be determined based on a time interval OFFSET1 between a transition point $t_2$ of the first comparison output signal CMO1 of the first comparator CMP1 and a transition point $t_1$ of the second comparison output signal CMO2 of the second comparator CMP2. For example, in Equation 1, the count value COUNT$_{COM\_OFFSET}$ compensated by the compensation signal COMP_OFFSET may be determined in proportion to the time interval OFFSET1.

As the time interval OFFSET1 between the transition point $t_2$ of the first comparison output signal CMO1 of the first comparator CMP1 and the transition point $t_1$ of the second comparison output signal CMO2 of the second comparator CMP2 increases, the trigger reference count value based on the compensation signal COMP_OFFSET may be decreased. The increase in the time interval OFF-SET1 between the transition point $t_2$ of the first comparison output signal CMO1 of the first comparator CMP1 and the transition point $t_1$ of the second comparison output signal CMO2 of the second comparator CMP2 indicates that the rising slope of the last pause section becomes relatively slow. As the rising slope of the last pause section becomes slow, the trigger reference count value of the trigger signal TRIGER_RES should be lowered.

Alternatively, as the time interval OFFSET1 between the transition point $t_2$ of the first comparison output signal CMO1 of the first comparator CMP1 and the transition point $t_1$ of the second comparison output signal CMO2 of the second comparator CMP2 decreases, the trigger reference count value based on the compensation signal COMP_OFF-SET may be increased. The decrease in the time interval OFFSET1 between the transition point $t_2$ of the first comparison output signal CMO1 of the first comparator CMP1 and the transition point $t_1$ of the second comparison output signal CMO2 of the second comparator CMP2 indicates that the rising slope of the last pause section becomes relatively steep. As the rising slope of the last pause section becomes steep, the trigger reference count value of the trigger signal TRIGER_RES may be relatively greater when it is compared with the case when the rising slope of the last pause section is slow.

The FDT compensation circuit 230 may generate, in synchronization with an internal clock signal CLK_INT1, a count value corresponding to the time interval OFFSET1 between the transition point $t_1$ of the first comparison output signal CMO1 of the first comparator CMP1 and the transition point $t_2$ of the second comparison output signal CMO2 of the second comparator CMP2. The FDT compensation circuit 230 may provide the trigger generation circuit 220 with the compensation signal COMP_OFFSET. The trigger generation circuit 220 may update the trigger reference count value based on the compensation signal COMP_OFF-SET to compensate the time interval OFFSET1. The count value COUNT$_{COM\_OFFSET}$ may be a count value corresponding to the time interval OFFSET1.

According to an embodiment, a compensation signal COMP_OFFSET may be generated based on the count value which corresponds to a time interval COMPENSATION OFFSET between the rising time point to of the last pause section and the transition point $t_2$ of the output signal CMO1 of the first comparator CMP1 as shown in FIG. 12. The trigger reference count value may be determined based on the count value corresponding to the time interval COMPENSATION OFFSET.

For example, referring to FIG. 11 and FIG. 12, the FDT compensation circuit 230 may generate, in synchronization with the internal clock signal CLK_INT1, a count value for the time interval OFFSET1 between the transition point $t_1$ of the first comparison output signal CMO1 of the first comparator CMP1 and the transition point $t_2$ of the second comparison output signal CMO2 of the second comparator CMP2.

The FDT compensation circuit 230 may determine a count value for a time interval OFFSET2 in a rising section (a time point $t_0$ to a time point $t_1$) of the last pause section before the time point $t_1$ based on the count value for the time interval OFFSET1.

For example, the FDT compensation circuit 230 may include a register, and the register may store count value of the time interval OFFSET2 which may be proportional to the count value of the time interval OFFSET1. The FDT compensation circuit 230 may determine the count value of the time interval OFFSET2 with reference to the count value of the time interval OFFSET1.

The FDT compensation circuit 230 may generate the count value corresponding to the time interval COMPENSATION OFFSET by adding the count value for the time interval OFFSET1 based on the transition of the comparison output signals CMO1 and CMO2 and the count value for the time interval OFFSET2 based on the count value for the time interval OFFSET1. Also, the FDT compensation circuit 230 may provide the trigger generation circuit 220 with the compensation signal COMP_OFFSET for updating the trigger reference count value to compensate the count value corresponding to the time interval COMPENSATION OFFSET.

In Equation 1, the count value $COUNT_{COM\_OFFSET}$ compensated by the compensation signal COMP_OFFSET may include a count value corresponding to the time interval COMPENSATION OFFSET (i.e., the sum of the count value corresponding to the time interval OFFSET1 and the count value corresponding to the time interval OFFSET2 based on the count value corresponding to the time interval OFFSET1).

FIG. 13 is a block diagram illustrating an FDT compensation circuit 230 according to an embodiment.

The FDT compensation circuit 230 according to an embodiment may include a delay checking circuit 231, an FDT compensation determining circuit 233, and an FDT compensation updating circuit 235.

Referring to FIG. 12 and FIG. 13, the delay checking circuit 231 may generate, in synchronization with the internal clock signal CLK_INT1, a count value DELAY VALUE for the time interval OFFSET1 between the transition point $t_1$ of the first comparison output signal CMO1 of the first comparator CMP1 and the transition point $t_2$ of the second comparison output signal CMO2 of the second comparator CMP2. The delay checking circuit 231 may provide the count value DELAY VALUE to the FDT compensation determining circuit 233.

The delay checking circuit 231 may include a counter. Herein, the counter may perform a counting operation in synchronization with the internal clock signal CLK_INT1. In response to the transition of the second comparison output signal CMO2 of the second comparator CMP2, the counter of the delay checking circuit 231 may start the counting operation. In addition, in response to the transition of the first comparison output signal CMO1 of the first comparator CMP1, the counter of the delay checking circuit 231 may stop the counting operation.

The delay checking circuit 231 may convert the time interval OFFSET1 into the count value DELAY VALUE.

The FDT compensation determining circuit 233 may generate a compensation count value COMPENSATION VALUE based on the count value DELAY VALUE of the delay checking circuit 231. The FDT compensation updating circuit 235 updates the trigger reference count value of the trigger signal TRIGGER_RES based on the compensation count value COMPENSATION VALUE.

The FDT compensation determining circuit 233 may generate the compensation count value COMPENSATION VALUE. The FDT compensation updating circuit 235 updates the compensation signal COMP_OFFSET in Equation 1 based on the compensation count value COMPENSATION VALUE which is proportional to the time interval OFFSET1. The compensation count value COMPENSATION VALUE may be greater than the count value DELAY VALUE.

Alternatively, the compensation count value COMPENSATION VALUE may correspond to the time interval OFFSET1 in which the count value DELAY VALUE may be equal to the compensation count value COMPENSATION VALUE.

The FDT compensation determining circuit 233 may include a register, and the register may store the count value of the time interval OFFSET2 which corresponds to the count value of the time interval OFFSET1. The FDT compensation determining circuit 233 may determine the count value of the time interval OFFSET2 corresponds to the count value of the time interval OFFSET1.

The FDT compensation updating circuit 235 may output the compensation signal COMP_OFFSET based on the compensation count value COMPENSATION VALUE. The compensation signal COMP_OFFSET may be provided to the trigger generation circuit 220.

The compensation signal COMP_OFFSET may instruct the trigger generation circuit 220 to update the trigger reference count value reflecting the compensation count value COMPENSATION VALUE.

According to an example embodiment described with reference to FIGS. 11 to 13, based on detecting and measuring the rising slope of the last pause section of the envelope voltage signal VENV, the NFC card 100 may compensate the FDT count value. Accordingly, the fluctuation of FDT may be reduced, and compatibility between the NFC card 100 and the NFC reader 10 may be improved.

While the inventive concept has been particularly shown and described with reference to embodiments thereof, it will be understood that various changes in form and details may be made therein without departing from the spirit and scope of the following claims.

What is claimed is:

1. A near field communication (NFC) card comprising:
a rectification and filtering circuit configured to receive a radio signal and generate an envelope voltage signal based on the radio signal, and the envelope voltage signal including a plurality of pause sections; and
a frame delay time (FDT) counting circuit configured to detect a rising section of a last pause section, measure a rising slope of the last pause section and generate a trigger signal which triggers a transmitting operation of the NFC card within a FDT from the rising section of the last pause section, wherein the FDT counting circuit comprises a first comparator configured to compare the envelope voltage signal with a first reference voltage and output a first comparison output signal;

a second comparator configured to compare the envelope voltage signal with a second reference voltage and output a second comparison output signal;

an FDT compensation circuit configured to output a compensation signal based on the first comparison output signal and the second comparison output signal; and a trigger generation circuit configured to output the trigger signal based on the first comparison output signal and the compensation signal.

2. The NFC card of claim 1, wherein the trigger generation circuit is configured to perform an FDT counting operation in response to the first comparison output signal to obtain an FDT count value; and output the trigger signal when the FDT count value reaches a trigger reference count value, and wherein the trigger reference count value is compensated based on the compensation signal.

3. The NFC card of claim 2, wherein the trigger reference count value is determined by subtracting a compensation count value from a preset reference count value, wherein the compensation count value is a count value determined based on the rising slope of the last pause section.

4. The NFC card of claim 3, wherein the compensation count value is determined based on a time interval between a transition time point of the first comparison output signal and a transition time point of the second comparison output signal.

5. The NFC card of claim 3, wherein the compensation count value is proportional to a time interval between a transition time point of the first comparison output signal and a transition time point of the second comparison output signal.

6. The NFC card of claim 3, wherein the compensation count value corresponds to a count value measured based on a time interval between a transition time point of the first comparison output signal and a transition time point of the second comparison output signal.

7. The NFC card of claim 3, wherein the compensation count value is determined by adding a first count value measured based on a time interval between a transition time point of the first comparison output signal and a transition time point of the second comparison output signal to a second count value determined based on the first count value, and the second count value is proportional to the first count value.

8. A frame delay time (FDT) counting circuit in a near field communication (NFC) card, the FDT counting circuit comprising:

a first comparator configured to compare an envelope voltage signal with a first reference voltage and output a first comparison output signal;

a second comparator configured to compare the envelope voltage signal with a second reference voltage and output a second comparison output signal;

an FDT compensation circuit configured to generate a compensation signal based on the first comparison output signal and the second comparison output signal; and a trigger generation circuit configured to output a trigger signal based on the first comparison output signal and the compensation signal, wherein the trigger signal initiates a transmitting operation of the NFC card.

9. The FDT counting circuit of claim 8, wherein the trigger generation circuit is configured to perform an FDT counting operation in response to the first comparison output signal; and output the trigger signal when an FDT count value reaches a trigger reference count value, and wherein the trigger reference count value is compensated by the compensation signal.

10. The FDT counting circuit of claim 9, wherein the trigger reference count value is compensated by subtracting a compensation count value which is measured based on a rising slope of a pause section of a last data bit in a request data frame received by the NFC card.

11. The FDT counting circuit of claim 10, wherein the compensation count value for compensating the trigger reference count value is determined based on a time interval between a transition time point of the first comparison output signal and a transition time point of the second comparison output signal.

12. The FDT counting circuit of claim 10, wherein the compensation count value for compensating the trigger reference count value is proportional to a time interval between a transition time point of the first comparison output signal and a transition time point of the second comparison output signal.

13. The FDT counting circuit of claim 10, wherein the compensation count value for compensating the trigger reference count value corresponds to a time interval between a transition time point of the first comparison output signal and a transition time point of the second comparison output signal.

14. The FDT counting circuit of claim 10, wherein the compensation count value for compensating the trigger reference count value is determined by adding a first count value measured based on a time interval between a transition time point of the first comparison output signal and a transition time point of the second comparison output signal to a second count value determined based on the first count value, and the second count value is proportional to the first count value.

15. A near field communication (NFC) system comprising an NFC card, wherein the NFC card comprises:

a rectification and filtering circuit configured to receive a radio signal and generate an envelope voltage signal based on the radio signal, and the envelope voltage signal including a plurality of pause sections; and a frame delay time (FDT) counting circuit configured to detect a rising section of a last pause section, measure a rising slope of the last pause section, and generate a trigger signal based on the rising slope of the last pause section, and the trigger signal triggering a transmitting operation of the NFC card within a FDT from the rising section of the last pause section, wherein the FDT counting circuit comprises:

a first comparator configured to compare the envelope voltage signal with a first reference voltage and output a first comparison output signal;

a second comparator configured to compare the envelope voltage signal with a second reference voltage and output a second comparison output signal;

an FDT compensation circuit configured to output a compensation signal based on the first comparison output signal and the second comparison output signal; and a trigger generation circuit configured to output the trigger signal based on the first comparison output signal and the compensation signal.

16. The NFC system of claim 15, wherein the trigger generation circuit is configured to perform an FDT counting operation in response to the first comparison output signal; and output the trigger signal when an FDT count value reaches a trigger reference count value, and wherein the trigger reference count value is compensated based on the compensation signal.

17. The NFC system of claim 16, wherein the trigger reference count value is determined by subtracting a compensation count value from a preset count value, the compensation count value is generated based on the rising slope of the last pause section of a last data bit value in a request data frame received by the NFC card.

18. The NFC system of claim 17, wherein the compensation count value is determined based on a time interval between a transition time point of the first comparison output signal and a transition time point of the second comparison output signal.

19. The NFC system of claim 17, wherein the compensation count value is proportional to a time interval between a transition time point of the first comparison output signal and a transition time point of the second comparison output signal.

20. The NFC system of claim 17, wherein the compensation count value comprises a count value corresponding to a time interval between a transition time point of the first comparison output signal and a transition point of the second comparison output signal.

* * * * *